(12) United States Patent
Zhang

(10) Patent No.: US 11,963,323 B2
(45) Date of Patent: Apr. 16, 2024

(54) DISPLAY DEVICE AND METHOD FOR CONTROLLING THE SAME

(71) Applicant: Shanghai Tianma Micro-Electronics Co., Ltd., Shanghai (CN)

(72) Inventor: Xiaoyin Zhang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 185 days.

(21) Appl. No.: 17/546,589

(22) Filed: Dec. 9, 2021

(65) Prior Publication Data

US 2022/0104373 A1    Mar. 31, 2022

(30) Foreign Application Priority Data

Sep. 2, 2021   (CN) .......................... 202111025825.5

(51) Int. Cl.
*H05K 5/00* (2006.01)
*H05K 5/02* (2006.01)

(52) U.S. Cl.
CPC ......... *H05K 5/0226* (2013.01); *H05K 5/0017* (2013.01)

(58) Field of Classification Search
None
See application file for complete search history.

(56) References Cited

U.S. PATENT DOCUMENTS

| | | | | |
|---|---|---|---|---|
| 8,493,726 B2* | 7/2013 | Visser | ...................... | G09F 9/301 361/679.05 |
| 9,864,412 B2* | 1/2018 | Park | ...................... | G06F 1/1652 |
| 10,539,980 B2* | 1/2020 | Xu | .............................. | G09F 9/00 |
| 10,789,863 B2* | 9/2020 | Song | ....................... | H05K 1/189 |
| 11,403,974 B2* | 8/2022 | Kim | ....................... | G06F 1/1656 |
| 2010/0246113 A1* | 9/2010 | Visser | ..................... | G09F 9/301 361/679.3 |

FOREIGN PATENT DOCUMENTS

| | | |
|---|---|---|
| CN | 104536531 A | 4/2015 |
| CN | 206039368 U | 3/2017 |
| CN | 107545849 A | 1/2018 |
| CN | 209590703 U | 11/2019 |
| TW | 200815664 A | 4/2008 |

OTHER PUBLICATIONS

Chinese Office Action dated Dec. 5, 2022, issued in related Chinese Application No. 202111025825.5 filed Sep. 2, 2021, 9 pages.

* cited by examiner

*Primary Examiner* — Imani N Hayman
*Assistant Examiner* — Rashen E Morrison
(74) *Attorney, Agent, or Firm* — CHRISTENSEN O'CONNOR JOHNSON KINDNESS PLLC

(57) ABSTRACT

Provided are a display device and a method for controlling the same. The display device includes a flexible display screen and a control structure configured to control the flexible display screen to assume a folded state or an unfolded state. The control structure includes a guide rail assembly including guide rails. Two adjacent guide rails of the guide rails are slidably connected to each other, and the flexible display screen is unfolded along a first direction and folded along a second direction. A sliding direction of each of the guide rails is the same as the first direction or the second direction.

18 Claims, 16 Drawing Sheets

DISPLAY DEVICE AND METHOD FOR CONTROLLING THE SAME

CROSS-REFERENCE TO RELATED APPLICATIONS

The present application claims the benefit of priority to Chinese Patent Application No. 202111025825.5, filed on Sep. 2, 2021, the content of which is incorporated herein by reference in its entirety.

TECHNICAL FIELD

The present disclosure relates to the field of display technologies, and in particular, to a display device and a method for controlling a display device.

BACKGROUND

Flexible display technology is a main developing trend of the display technology. Flexible display screens are increasingly used in electronic equipment due to their properties including low power consumption and flexibility. However, typical flexible display screens are difficult to be flattened after being deformed by folding, curling, etc., and the screen cannot be kept in a same display plane, resulting in poor display effect.

SUMMARY

In an aspect, the present disclosure provides a display device, where the display device includes a flexible display screen, and a control structure configured to control the flexible display screen to assume a folded state and an unfolded state. The control structure includes a guide rail assembly including guide rails, and two adjacent guide rails of the guide rails are slidably connected to each other. The flexible display screen is unfolded along a first direction and folded along a second direction, and a sliding direction of each of the guide rails is the same as the first direction or the second direction.

In another aspect, the present disclosure provides a method for controlling a display device, which is used to control the above display device. The method includes when the flexible display screen is switched from the folded state to the unfolded state, sliding the guide rails of the control structure along the first direction to control the flexible display screen to unfold along the first direction; and when the flexible display screen is switched from the unfolded state to the folded state, sliding the guide rails along the second direction to control the flexible display screen to fold along the second direction.

BRIEF DESCRIPTION OF DRAWINGS

In order to better illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DETAILED DESCRIPTION OF EMBODIMENTS

In order to explain technical solutions of the present disclosure, embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing particular embodiments but not intended to limit the present disclosure. Unless otherwise noted in the context, the singular form expressions "a", "an", "the" or "said" used in the embodiments and appended claims of the present disclosure are also intended to represent a plural form.

It should be understood that the term "and/or" as used herein is merely an association describing the associated object, indicating that there can be three relationships. For example, A and/or B can indicate three cases: A alone; A and B; B alone. In addition, a character "/" herein generally indicates that the associated objects are in an "or" relationship.

Depending on the context, the word "if" used herein can be interpreted as "at the time" or "when" or "in response to determination" or "in response to detection". Similarly, depending on the context, the phrase "if determined" or "if detected (statement or event)" can be interpreted as "when determining" or "in response to determining" or "when detecting (statement or event)" or "in response to detecting (statement or event)".

Figure 1:
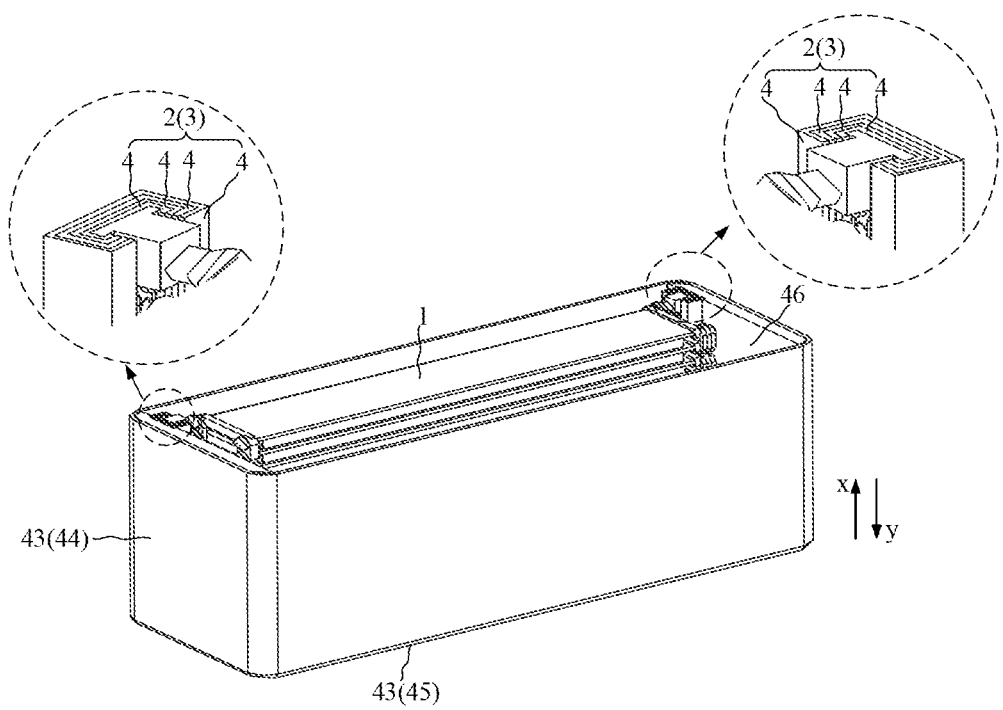
FIG. 1 is a schematic diagram of a display device in a folded state provided by an embodiment of the present disclosure.
Figure 2:
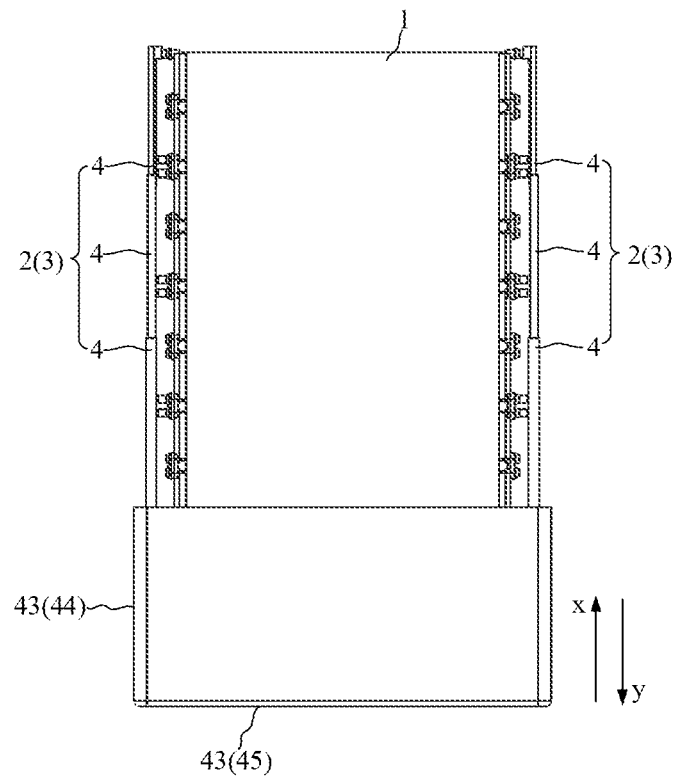
FIG. 2 is a schematic diagram of a display device in an unfolded state provided by an embodiment of the present disclosure.

An embodiment of the present disclosure provides a display device, as shown in FIG. 1 and FIG. 2. FIG. 1 is a schematic diagram of a display device in a folded state provided by an embodiment of the present disclosure, and FIG. 2 is a schematic diagram of a display device in an unfolded state provided by an embodiment of the present disclosure. The display device includes a flexible display screen 1 and a control structure 2, and the control structure 2 is configured to control the flexible display screen 1 to be in the folded state and the unfolded state.

The control structure 2 includes a guide rail assembly 3 having guide rails 4. Two adjacent guide rails 4 are slidably connected to each other. The flexible display screen 1 extends in a first direction x and is folded in a second direction y. A sliding direction of the guide rail 4 is the same as the first direction x or the second direction y.

Figure 3:
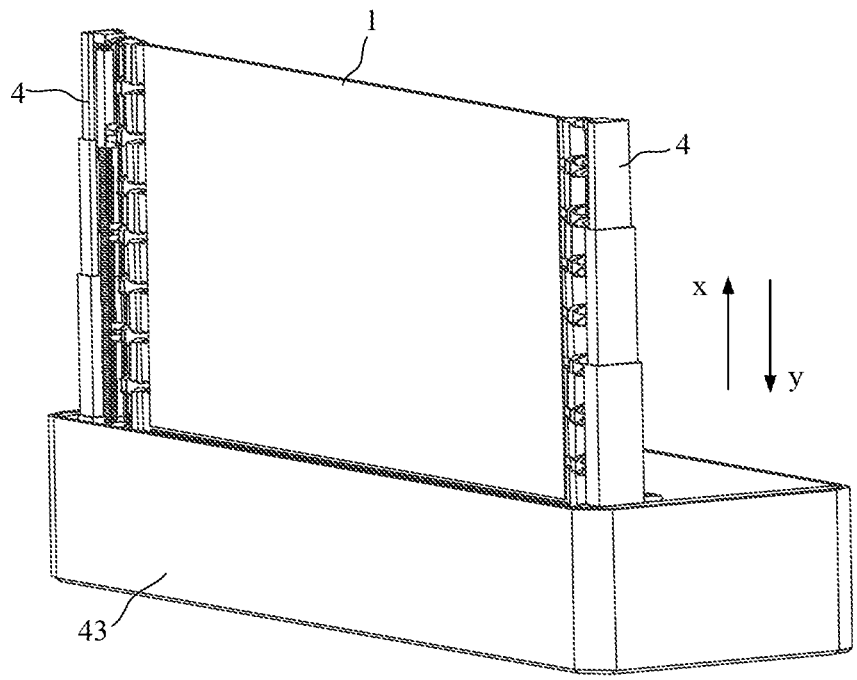
FIG. 3 is a schematic diagram of sliding of guide rails provided by an embodiment of the present disclosure.

For example, in conjunction with a sliding diagram of the guide rail shown in FIG. 3, when the flexible display screen 1 is controlled to switch from the folded state to the unfolded state, the guide rails 4 slide upward in the first direction x to drive the flexible display screen 1 to rise from the bottom, so that the screen of the flexible display screen 1 is flattened. When the flexible display screen 1 is controlled to switch from the unfolded state to the folded state, the guide rails 4 slide down in the second direction y to drive the screen of the flexible display screen 1 to fold or curl, so that the screen of the flexible display screen 1 is folded.

In an embodiment of the present disclosure, the control structure 2 controls the flexible display screen 1 to be folded or flattened. When the flexible display screen 1 is switched from the folded state to the unfolded state, the control structure 2 can be configured to control a screen shape of the flexible display screen 1 formed after unfolding the flexible display screen, so that the screen of the flexible display screen 1 is flattened by the guide rail 4 to present a flat surface. At this time, the screen is located in a same unfolded plane, so as to avoid unevenness such as screen wrinkles, thereby improving the flattening effect of the flexible display screen, and further improving the display effect of the display device. The control structure 2 can also control the flexible display screen 1 to fold, so that the display device has a smaller volume in the folded state and occupies less space.

Figure 4:
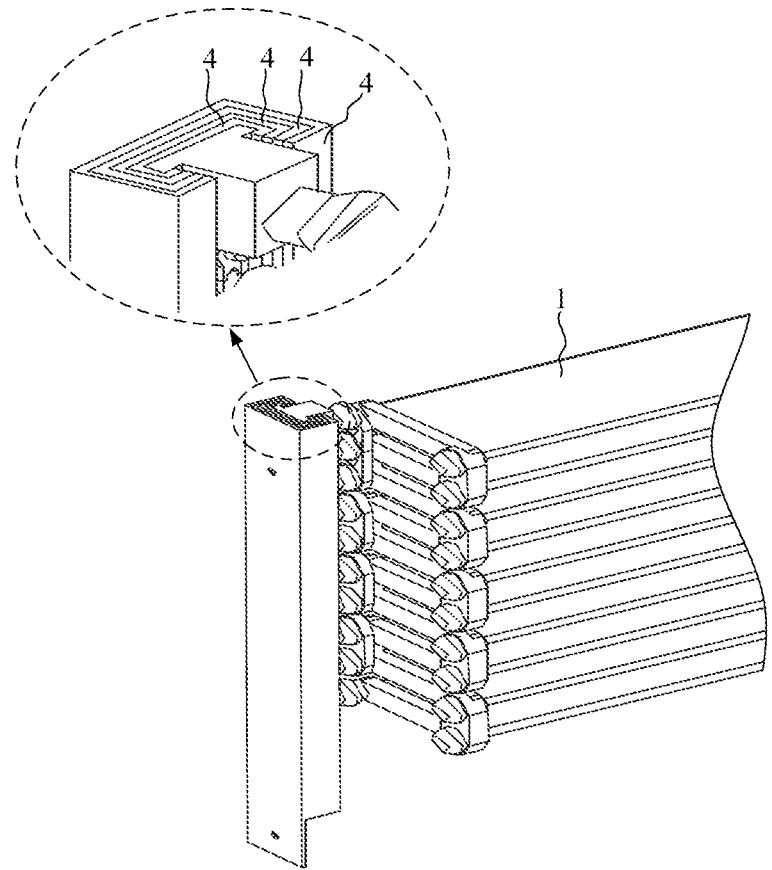
FIG. 4 is a schematic diagram of sleeving of guide rails provided by an embodiment of the present disclosure.

FIG. 4 is a schematic diagram of sleeving of guide rails provided by an embodiment of the present disclosure. In an embodiment, as shown in FIG. 4, when the flexible display screen 1 is in the folded state, the guide rails 4 are successively sleeved. In this way, the guide rails 4 can occupy smaller space in the folded state, and the flexible display screen 1 can be controlled to have a smaller folded volume, which achieves better folded effect.

Taking the guide rail assembly 3 including n guide rails 4 as an example, n is a positive integer greater than or equal to 2. When the flexible display screen 1 is in the unfolded state, the first to $n^{th}$ guide rails 4 are arranged sequentially from top to bottom. In an embodiment, when multiple guide rails 4 are successively sleeved, the $n^{th}$ guide rail 4 is located at the outermost side, and the first guide rail 4 is located at the innermost side.

Figure 5:
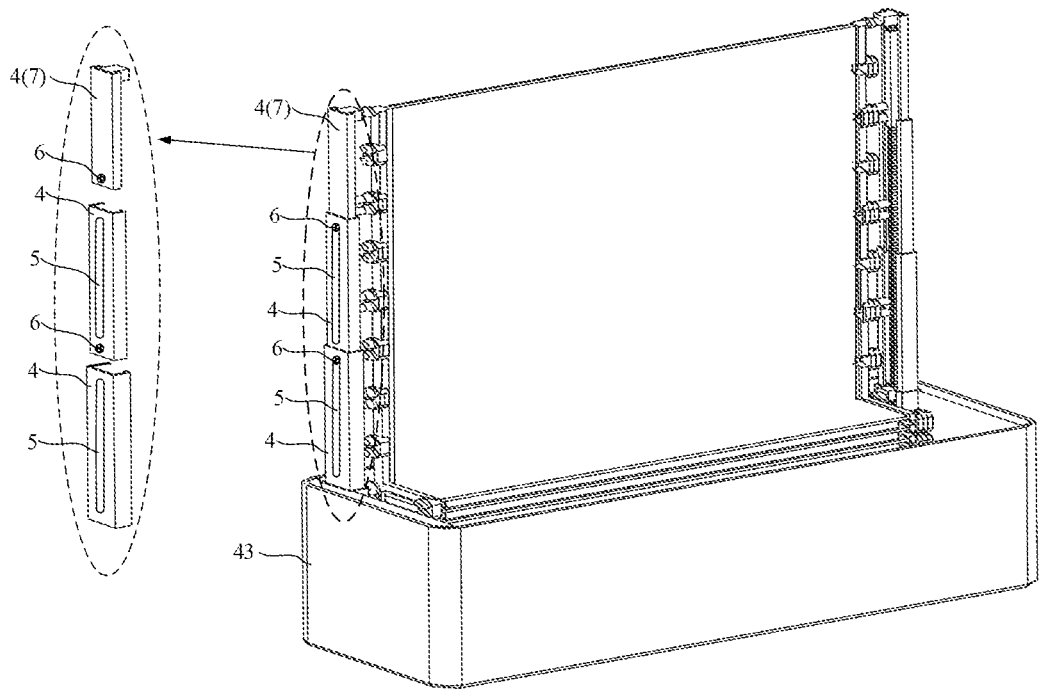
FIG. 5 is a schematic diagram of guide rails provided by an embodiment of the present disclosure.

FIG. 5 is a schematic diagram of a guide rail provided by an embodiment of the present disclosure. In an embodiment, as shown in FIG. 5, the guide rail 4 includes at least one of a sliding groove 5 or a limiting post 6, and the limiting post 6 of one guide rail 4 is slidably inserted into the sliding groove 5 of another guide rail 4 adjacent to this guide rail 4.

For example, among the n guide rails 4 in the guide rail assembly 3, the first guide rail 4 is provided with the limiting post 6, the $n^{th}$ guide rail 4 is provided with a sliding groove 5, and the second to the $(n-1)^{th}$ guide rails 4 are provided with both the sliding groove 5 and the limiting post 6. The limiting post 6 of the $i^{th}$ guide rail 4 can be slidably inserted into the sliding groove 5 of the $(i+1)^{th}$ guide rail 4, where $1 \leq i \leq n-1$. When the $i^{th}$ guide rail 4 slides upward along the first direction x, the limiting post 6 of the $i^{th}$ guide rail 4 slides synchronously in the sliding groove 5 of the $(i+1)^{th}$ guide rail 4. When the limiting post 6 slides to a top end of the sliding groove 5, the $(i+1)^{th}$ guide rail 4 is driven to start to slide upward along the first direction x. When the $i^{th}$ guide rail 4 slides down along the second direction y, the limiting post 6 of the $i^{th}$ guide rail 4 sliding synchronously in the sliding groove 5 of the $(i+1)^{th}$ guide rail 4. When the limiting post 6 slides to the bottom end of the sliding groove 5, the $(i+1)^{th}$ guide rail 4 is driven to start to slide down along the second direction y.

Figure 6:
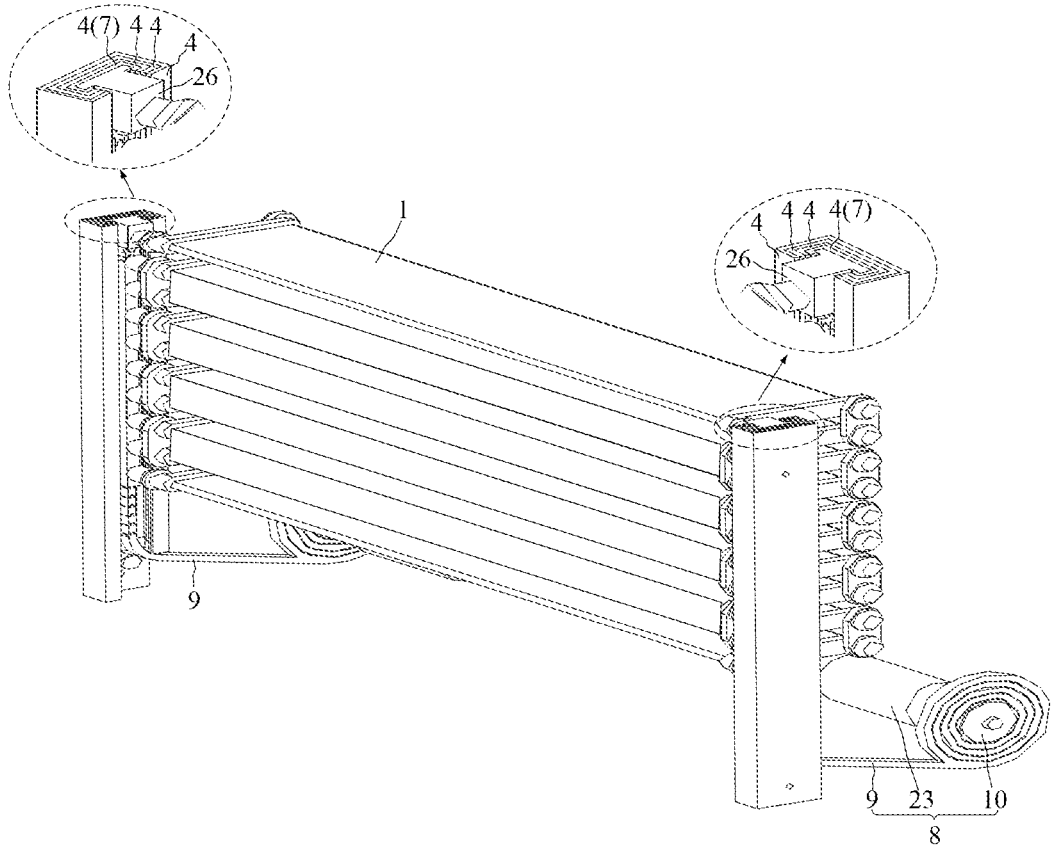
FIG. 6 is another schematic diagram of a display device in a folded state provided by an embodiment of the present disclosure; FIG.
Figure 7:
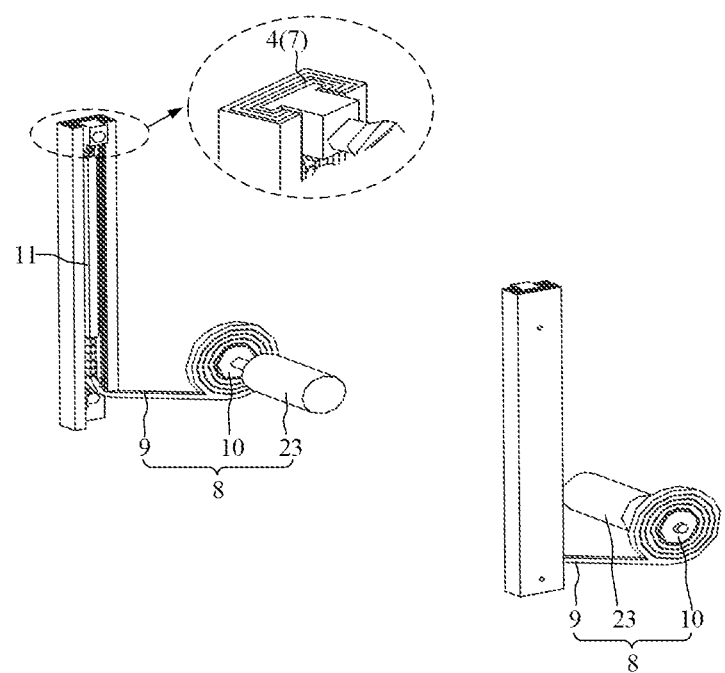
FIG. 7 is a schematic diagram of a sliding control assembly provided by an embodiment of the present disclosure.

FIG. 6 is another schematic diagram of a display device in a folded state provided by an embodiment of the present disclosure, and FIG. 7 is a schematic diagram of a sliding control assembly provided an embodiment of the present disclosure. In an embodiment, in conjunction with FIG. 5 to FIG. 7, when the flexible display screen 1 is in the unfolded state, along an arrangement direction of the multiple guide rails 4, the first one of the guide rails 4 is a first guide rail 7. The control structure 2 further includes a sliding control assembly 8 connected to the first guide rail 7 and configured to control the first guide rail 7 to move along the first direction x or the second direction y.

For example, when the flexible display screen 1 is switched from the folded state to the unfolded state, the sliding control assembly 8 controls the first guide rail 7 to move upward along the first direction x. When the limiting post 6 of the first guide rail 7 slides to the top end of the sliding groove 5 of the second guide rail 4, the second guide rail 4 is driven to move upward along the first direction x, . . . , and so on, until the guide rails 4 are unfolded.

In an embodiment, a limit structure can be arranged between the limiting post 6 of one guide rail 4 and the sliding groove 5 of another guide rail 4 adjacent to this guide rail 4. When the limiting post 6 of one guide rail 4 slides to be the top end of the sliding groove 5 of another guide rail 4 adjacent to this guide rail 4, the limiting post 6 and the sliding groove 5 are relatively limited. For example, the limiting post 6 is stuck at the top end of the sliding groove 5, and the limit force is designed to fix the two guide rails 4. Based on such design, when the flexible display screen 1 is switched from the unfolded state to the folded state, the sliding control assembly 8 applies a force to the first guide rail 7 in the second direction y, so that the limiting post 6 of the first guide rail 7 is released from the limit of the sliding groove 5 of the second guide rail 4, thereby driving the first guide rail 7 to slide down. During the sliding process of the first guide rail 7, the limiting posts 6 and the sliding grooves 5 of the remaining guide rails 4 are limited and fixed. Therefore, the relative positional relationships of the remaining guide rails 4 are not changed. Until the limiting post 6 of the first guide rail 7 slides to the bottom end of the sliding groove 5 of the second guide rail 4, a downward force is applied to the second guide rail 4, so that the limiting post 6 of the second guide rail 4 can slide down in the sliding groove 5 of the third guide rail 4, rather than being fixed on the top end of the sliding groove 5 of the third guide rail 4, thereby driving the second guide rail 4 to slide down, . . . , and so on, until the first to $(n-1)^{th}$ guide rails all slide down, thereby achieving that the multiple guide rails 4 are successively sleeved.

In another embodiment, when the limiting post 6 of one guide rail 4 slides to the top end of the sliding groove 5 of another guide rail 4 adjacent to this guide rail 4 and is not limited and fixed. In this case, the first guide rail 7 is supported by the sliding control assembly 8 to maintain the unfolded shape of the multiple guide rails 4. Based on such design, when the flexible display screen 1 is switched from the unfolded state to the folded state, the sliding control assembly 8 applies a downward force to the first guide rail 7. If there is a small or no friction formed between the adjacent guide rails 4, under the action of gravity, the $(n-1)^{th}$ guide rail 4 will slide down first. After the $(n-1)^{th}$ guide rail 4 is sleeved with the $n^{th}$ guide rail 4, the $(n-2)^{th}$ guide rail will continue to slide down, . . . , and so on, until the first guide rail 7 slides down, and thus the multiple guide rails 4 are successively sleeved.

In an embodiment of the present disclosure, the sliding control assembly 8 is connected to the first guide rail 7 so as to control the multiple guide rails 4 to slide in sequence. When the guide rail assembly 3 is unfolded, the multiple guide rails 4 are unfolded more completely.

In an embodiment, referring to FIG. 6 and FIG. 7 again, the sliding control assembly 8 includes a hinge 9 and a first rotating shaft 10. The hinge 9 can be a flexible hinge or a semi-flexible hinge. The hinge 9 includes a first end connected to the first guide rail 7 and a second end connected to the first rotating shaft 10 and wound around the first rotating shaft 10. For example, the hinge 9 is fixedly connected to the first guide rail 7 and the first rotating shaft 10.

When the flexible display screen 1 is switched from the folded state to the unfolded state, the first rotating shaft 10 rotates to control the hinge 9 wound around the first rotating shaft 10 to release, so that the hinge 9 drives the first guide rail 7 to move along the first direction x, thereby making the first guide rail 7 drive the remaining guide rails 4 to move along the first direction x to control the screen of the flexible display 1 to be flattened. In this case, the hinge 9 supports the first guide rail 7 to keep the guide rail 4 in the unfolded state. When the flexible display screen 1 is switched from the unfolded state to the folded state, the first rotating shaft 10 rotates, and the hinge 9 is controlled to wind around the first rotating shaft 10, so that the hinge 9 drives the first guide rail 7 to move in the second direction y, thereby making the second guide rail 4 drive the remaining guide rails 4 to move along the second direction y to control the screen of the flexible display screen 1 to be folded.

Figure 8:
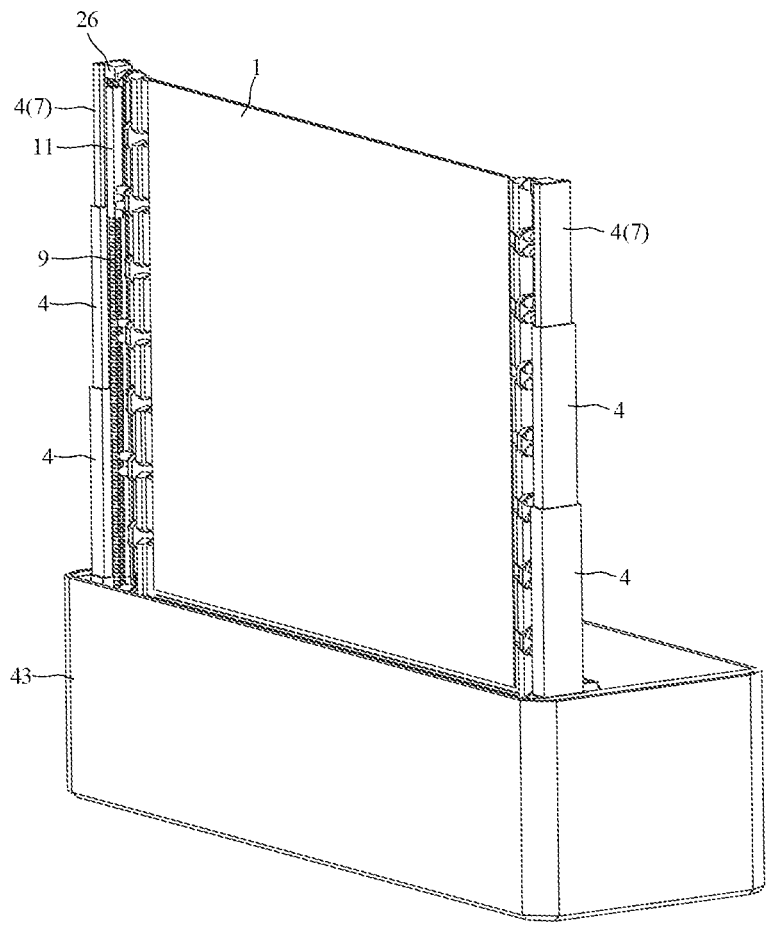
FIG. 8 is a schematic diagram of a first limiting groove provided by an embodiment of the present disclosure.
Figure 9:
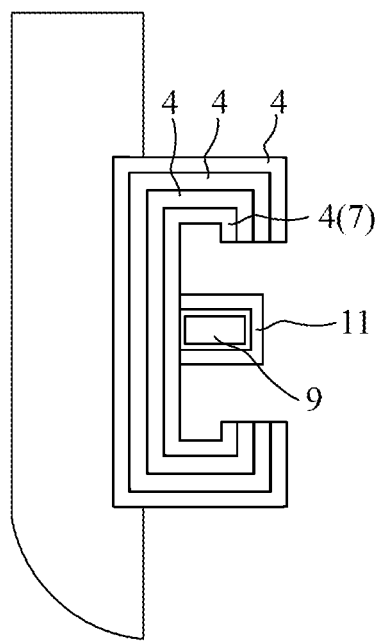
FIG. 9 is a top view of a first limiting groove provided by an embodiment of the present disclosure.

FIG. 8 is a schematic diagram of a first limiting groove provided by an embodiment of the present disclosure, and FIG. 9 is a top view of a first limiting groove provided by an embodiment of the present disclosure. The guide rail assembly 3 further include a first limiting groove 11 connected to the first guide rail 7 and configured to cause the hinge 9 extend along the first direction x or the second direction y.

For example, the first limiting groove 11 is fixedly connected to the first guide rail 7, and the first limiting groove 11 and the first guide rail 7 form a channel through which the hinge 9 can pass. The first limiting groove 11 limits a part of the hinge 9 passing through the channel, which can make this part of the hinge 9 extend straight along the first direction x or the second direction y to avoid of being bent, so that the hinge 9 exerts a more stable thrust on the first guide rail 7 along the first direction x or a pulling force along the second direction y, thereby improving the reliability of the sliding of the guide rail 4 along the first direction x or the second direction y, and also improving the supporting performance of the hinge 9 on the first guide rail 7 to avoid shaking of the first guide rail 7 when the multiple guide rails 4 are unfolded.

With reference to FIG. 6 to FIG. 8 again, the first limiting groove 11 and the first guide rail 7 define a tubular channel, that is, the first limiting groove 11 is a continuous limiting groove extending along a straight line. The hinge 9 includes a part located in the tubular channel, which can ensure that the hinge 9 located on a side of the first guide rail 7 extends along a straight line and further improve the reliability of the hinge 9 to drive the guide rail 4 to slide.

Figure 10:
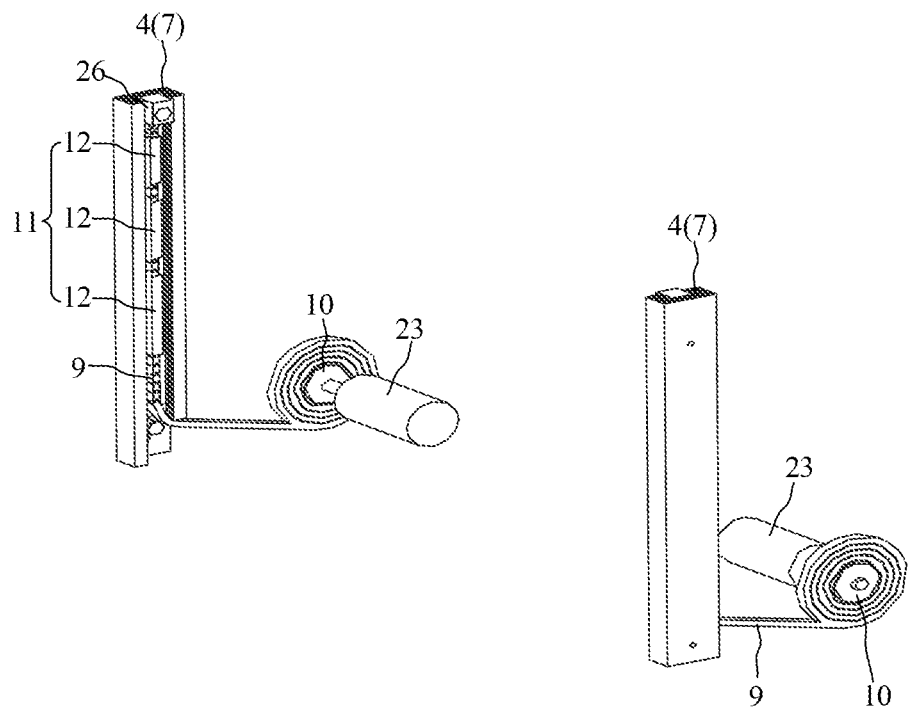
FIG. 10 is another schematic diagram of a first limiting groove provided by an embodiment of the present disclosure.

FIG. 10 is another schematic diagram of a first limiting groove provided by an embodiment of the present disclosure. In another embodiment, as shown in FIG. 10, the first limiting groove 11 includes multiple first limiting sub-grooves 12 arranged at intervals in the first direction x or in the second direction y. In order to ensure that the hinge 9 on the side of the first guide rail 7 can extend along the straight line, a distance between two adjacent first sub-limiting grooves 12 can be set to be smaller. For example, in conjunction with FIG. 13, when the hinge 9 includes multiple hinge components 14, every two hinge components 14 are connected to each other, and a distance between two adjacent first limiting sub-grooves 12 can be smaller than a sum of lengths of the two adjacent hinge components 14 to reduce a length of the hinge 9 exposed in a gap formed between the two first limiting sub-grooves 12 to avoid bending of the hinge 9 in this area. Taking the hinge component 14 on a side of the first guide rail 7 as an example, the length of the hinge component 14 refers to a length of the hinge component 14 in the first direction x or in the second direction y.

Figure 11:
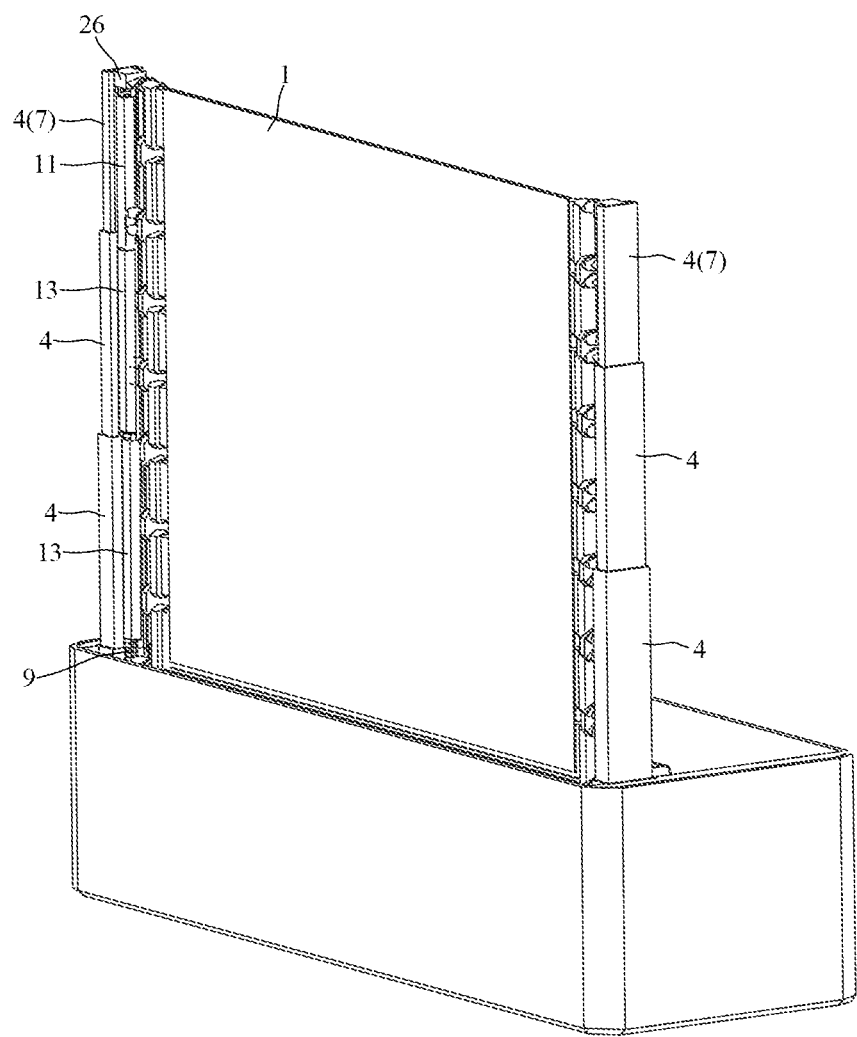
FIG. 11 is another schematic diagram of a second limiting groove provided by an embodiment of the present disclosure.
Figure 12:
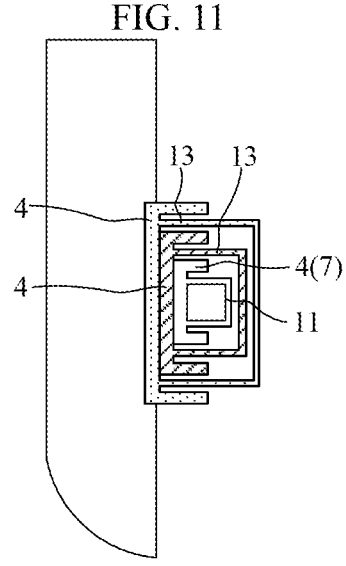
FIG. 12 is a top view of a second limiting groove provided by an embodiment of the present disclosure.

FIG. 11 is a schematic diagram of a second limiting groove provided by an embodiment of the present disclosure, and FIG. 12 is a top view of a second limiting groove provided by an embodiment of the present disclosure. In an embodiment, as shown in FIG. 11 and FIG. 12, the guide rail assembly 3 further include a second limiting groove 13 configured to make the hinge 9 extend along the first direction x or the second direction y. The second limiting groove 13 is connected to the guide rail 4 except for the first guide rail 7. When the flexible display screen 1 is in the folded state, two adjacent second limiting grooves 13 are sleeved and the second limiting groove 13 adjacent to the first limiting groove 11 is sleeved with the first limiting groove 11.

With the second limiting groove 13, the second limiting groove 13 limits the extension direction of the hinge 9 on the side of the remaining rail 4 except the first rail 7. The second limiting groove 13 and the first limiting groove 11 cooperate to make the hinge 9 with a larger length extend along a straight line, which improves the reliability of the hinge 9 in applying thrust or pulling force to the first guide rail 7.

Figure 13:
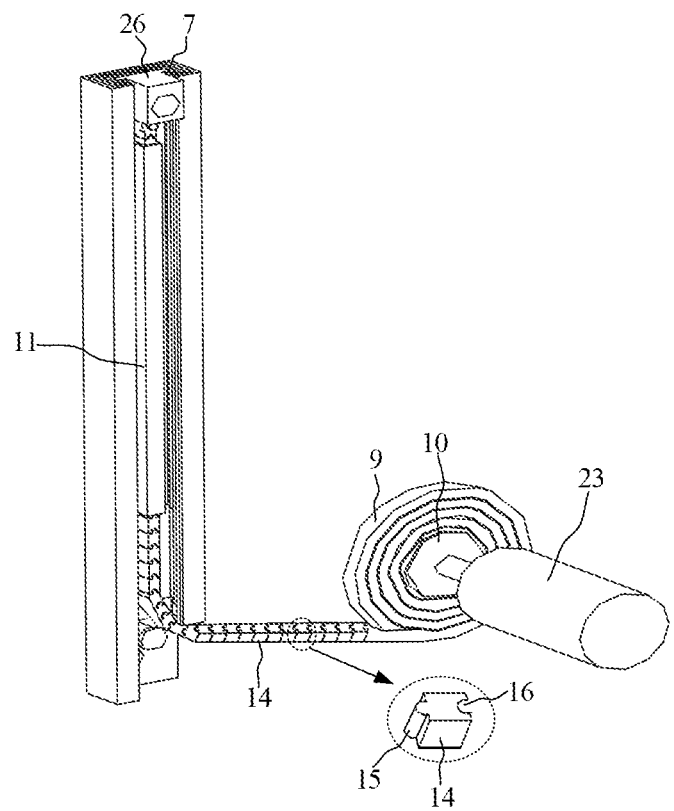
FIG. 13 is a schematic diagram of a hinge component of a hinge provided by an embodiment of the present disclosure.

FIG. 13 is a schematic diagram of a hinge component in a hinge provided by an embodiment of the present disclosure. In an embodiment, as shown in FIG. 13, the hinge 9 includes multiple hinge components 14, every two hinge components 14 are connected to each other, and a protrusion 15 and a recess 16 are provided on two opposite sides of the component 14, respectively. When the display device is switched from the folded state to the unfolded state, in the released hinge 9, the protrusion 15 of one hinge component 14 is inserted into the recess 16 of another hinge component 14 adjacent to the one hinge component 14. The hinge components 14 having such structures makes it easier for the hinge 9 to maintain to extend in a straight line after the hinge components 14 are mutually inserted into each other, achieving better effect of driving the first guide rail 7.

Figure 14:
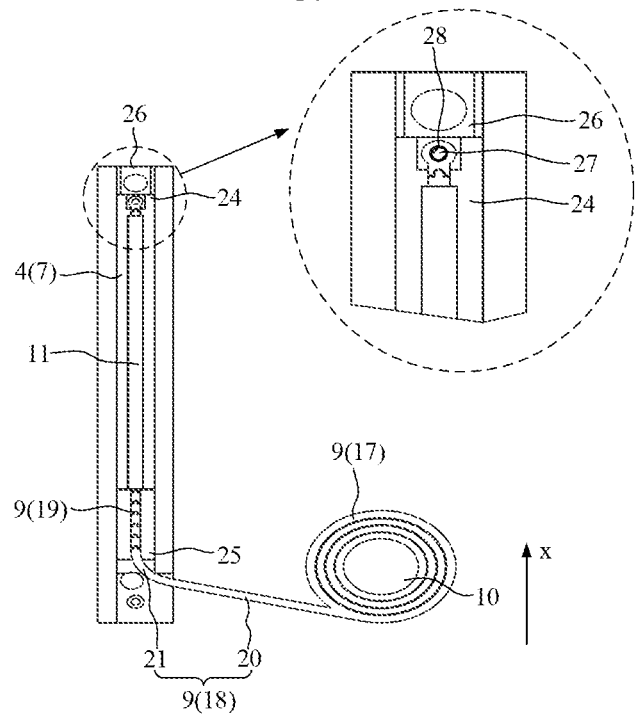
FIG. 14 is a schematic diagram of a hinge provided by an embodiment of the present disclosure.

FIG. 14 is a schematic diagram of a hinge provided by an embodiment of the present disclosure. In an embodiment, as shown in FIG. 14, the hinge 9 includes a first hinge portion 17, a second hinge portion 18, and a third hinge portion 19 that are sequentially connected to each other. The first hinge portion 17 is wound around the first rotating shaft 10, and the third hinge portion 19 is located in the guide rail 4. The second hinge portion 18 includes a first chain section 20 and a second chain section 21. The first chain section 20 is connected to the first hinge portion 17 and extends along a straight line intersecting the first direction x and the second direction y. The second chain section 21 is connected between the first chain section 20 and the third hinge portion 19, and the second chain section 21 extends along an arc.

The third hinge portion 19 being located in the guide rail 4 indicates that when the multiple guide rails 4 are successively sleeved, a part of the hinge 9 located on a side of the first guide rail 7 is the third hinge portion 19, and when the multiple guide rails 4 slide to unfold, the part of the hinge 9 on one side of the multiple guide rails 4 is the third hinge portion 19, and the length of the third hinge portion 19 is different based on the specific states. In order to make the first chain section 20 extend in a straight line, a supporting structure can be provided under the first chain section 20. The supporting structure can be fixed on the bottom wall of the housing of the display device.

Based on the above structure, the first section 20 extending in a straight line can apply a more stable thrust or pulling force on the second chain section 21 and the third hinge portion 19. The second chain section 21 extending in an arc can be provided between the first section 20 and the third hinge portion 19 to achieve a smooth transition between the first chain section 20 and the third hinge portion 19. In this case, sharp corners will be formed at a connection position where the first chain section 20 and the third hinge portion 19 are connected to each other. When the hinge component 14 moves to the connection position, the protrusion 15 of one hinge component 14 will not be separated from the recessed 16 of another hinge component 14 adjacent to the one hinge component 14, which improves the stability of the hinge 9 during operation.

In an embodiment, with reference to FIG. 6 and FIG. 7 again, the sliding control assembly 8 further includes a motor 23 connected to the first rotating shaft 10 and configured to control the first rotating shaft 10 to rotate. For example, a winding speed or unwinding speed of the hinge 9 around the first rotating shaft can be controlled by controlling a rotation speed of the motor 23, and then the sliding speed of the guide rail 4 can thus be controlled to control the state switching time of the flexible display screen 1.

In an embodiment, with reference to FIG. 14 again, the first guide rail 7 includes a first end 24 and a second end 25, a direction from the second end 25 to the first end 24 is the first direction x, and the first end of the hinge 9 is connected to the first end 24.

For example, the control structure 2 further includes a sleeve 26 located at the first end 24 of the first guide rail 7. The sleeve 26 can be fixedly connected to the first end 24 by bonding. The sleeve 26 includes a positioning post 27, a hinge 9 includes a positioning hole 28 at the first end of the hinge 9, and the positioning hole 28 and the positioning post 27 are fixed to each other through inserting, so as to realize the connection between the first end of the hinge 9 and the first end 24 of the first guide rail 7. In other embodiments of the present disclosure, the first end 24 of the first guide rail 7 can also be directly provided with a positioning post, and the positioning post is directly inserted into the positioning hole at the first end of the hinge 9.

In an embodiment of the present disclosure, the hinge 9 is connected to the first end 24 of the first guide rail 7. After the hinge 9 drives the multiple guide rails 4 to unfold one by one, the hinge 9 on the side of the first guide rail 7 can support the first guide rail 7 to prevent the first guide rail 7 from shaking, thereby improving the stability of the unfolded state of the flexible display screen 1.

Figure 15:
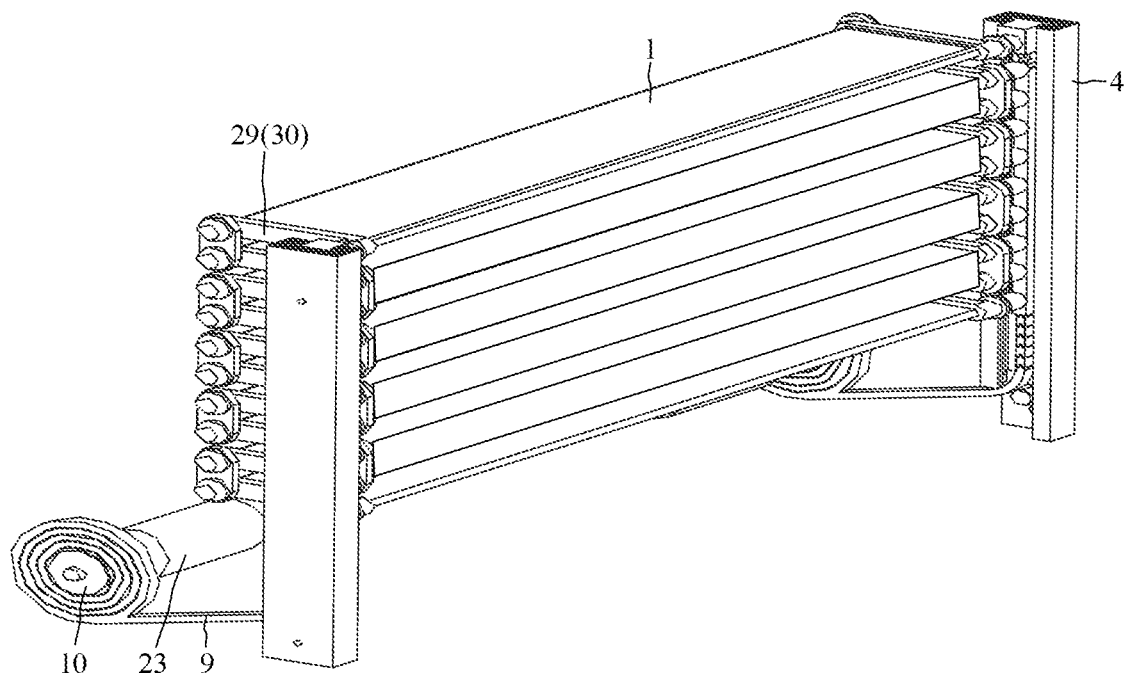
FIG. 15 is a schematic diagram of a supporting assembly of a display device in a folded state provided by an embodiment of the present disclosure.
Figure 16:
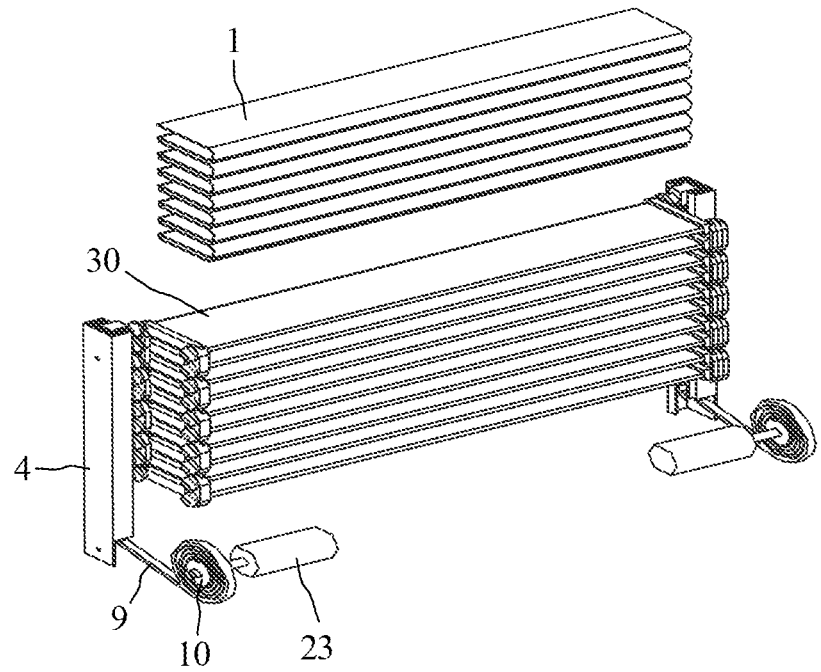
FIG. 16 is a schematic diagram illustrating that a flexible display screen and a supporting assembly of FIG. 15 are separated from each other.
Figure 17:
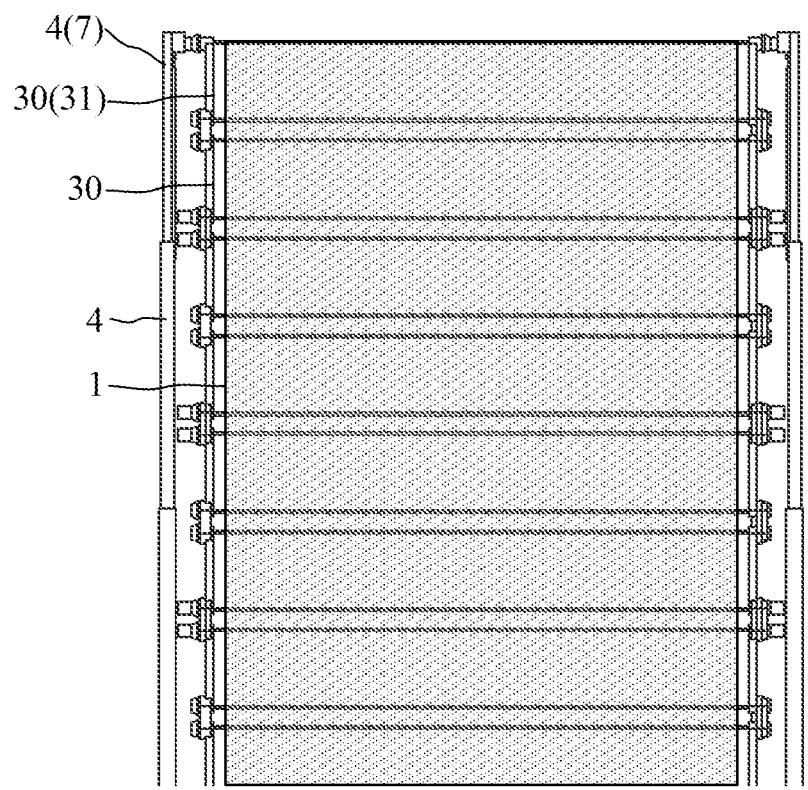
FIG. 17 is a schematic diagram of a supporting assembly of a display device in a unfolded state provided by an embodiment of the present disclosure.

FIG. 15 is a schematic diagram of a supporting assembly of a display device in a folded state provided by an embodiment of the present disclosure, FIG. 16 is a schematic diagram illustrating that a flexible display screen and a supporting assembly that correspond to FIG. 15 are separated, and FIG. 17 is a schematic diagram of a supporting assembly of a display device in a unfolded state provided by an embodiment of the present disclosure. The control structure 2 further includes a supporting component 29, which includes multiple support plates 30 sequentially connected to each other end to end. The supporting plates 30 are arranged along the first direction x and are configured to support the flexible display screen 1. When the flexible display screen 1 is switched from the folded state to the unfolded state, the guide rail 4 slides along the first direction x to drive the multiple supporting plates 30 to unfold one by one. When the flexible display 1 is switched from the unfolded state to the folded state, the guide rail 4 slides along the second direction y to drive the supporting assembly 29 to fold.

For example, the supporting plate 30 includes a support surface for supporting the flexible display screen 1. When the flexible display screen 1 is switched from the folded state to the unfolded state, the guide rail 4 slides along the first direction x to drive the multiple supporting plates 30 to unfold one by one. The support surfaces of the multiple supporting plates 30 after unfolding are located in a same plane, so that the screen supporting the flexible display screen 1 is also located in a same plane, thereby improving the flatness of the screen. When the flexible display screen 1 is switched from the unfolded state to the folded state, the guide rail 4 slides along the second direction y, which drives the multiple supporting plates 30 to fold, thereby driving the flexible display screen 1 to fold the screen.

In an embodiment, the supporting plate 30 is fixedly connected to the flexible display screen 1. For example, the flexible display screen 1 can be fixed to the supporting plate 30 by bonding, so as to prevent the flexible display screen 1 from being separated from the supporting plate 30 when the supporting plate 30 drives the flexible display screen 1 to be flattened or folded.

In an embodiment, referring to FIG. 17 again, when the flexible display screen 1 is in the unfolded state, along the arrangement direction of the multiple guide rails 4, a first one of the guide rails 4 is a first guide rail 7. Along the first direction x, a first one of the supporting plates 30 is a first supporting plate 31 connected to the first guide rail 7, so that when the guide rails 4 are unfolded, the top of the flexible display screen 1 is located at a side of the first guide rail 7. Under the premise where there are a certain number of guide rails 4, the flexible display screen 1 with a larger length can be provided, thereby presenting a larger image, and improving appearance of the display device in the unfolded state.

Figure 18:
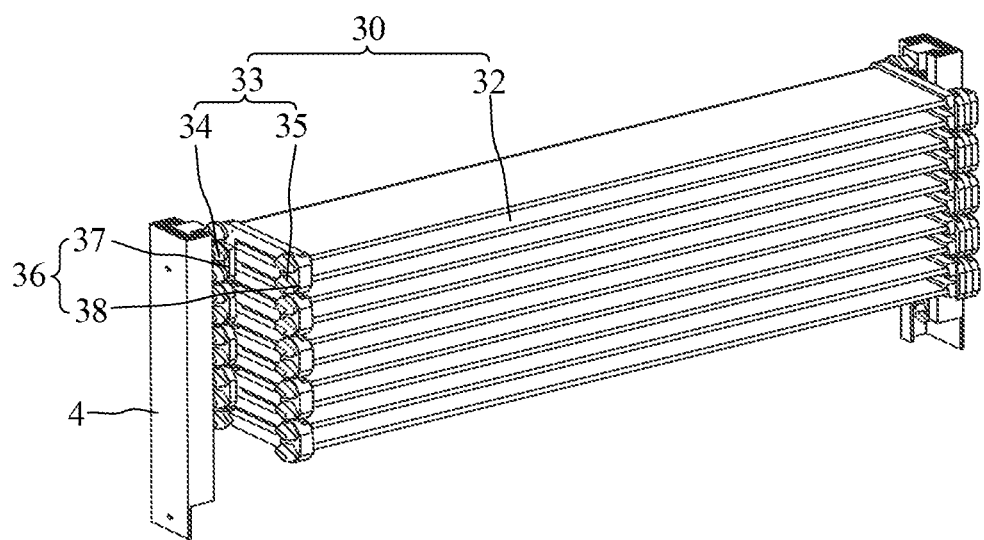
FIG. 18 is a schematic diagram of supporting plates in a folded state provided by an embodiment of the present disclosure.
Figure 19:
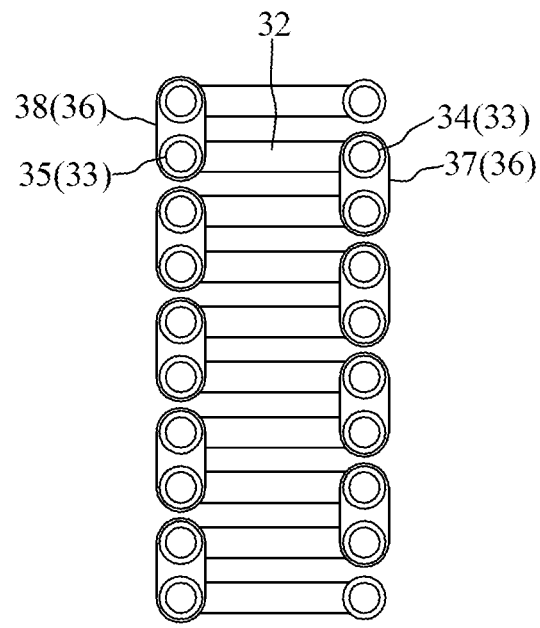
FIG. 19 is another schematic diagram of supporting plates in a folded state provided by an embodiment of the present disclosure.
Figure 20:
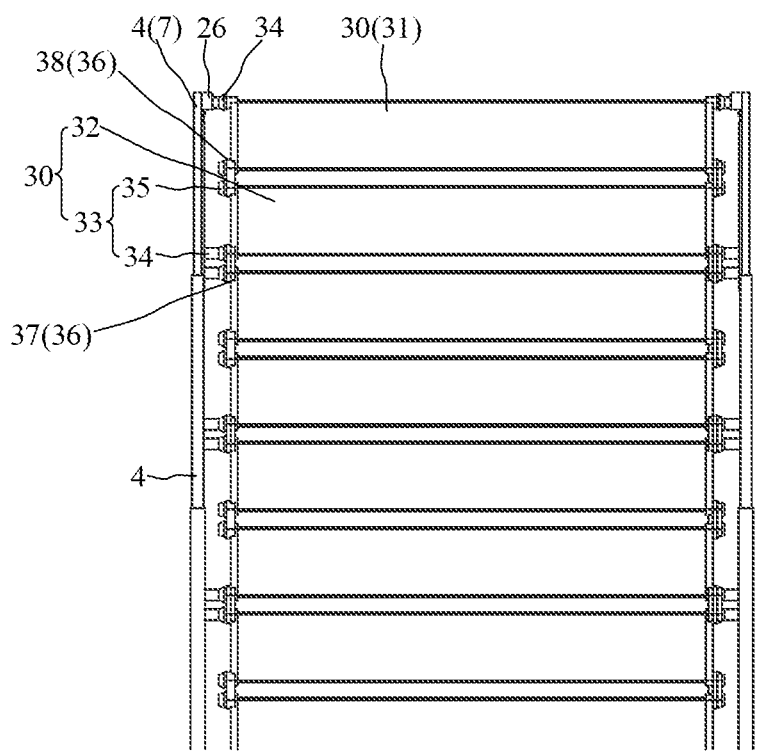
FIG. 20 is a schematic diagram of supporting plates in an unfolded state provided by an embodiment of the present disclosure.
Figure 21:
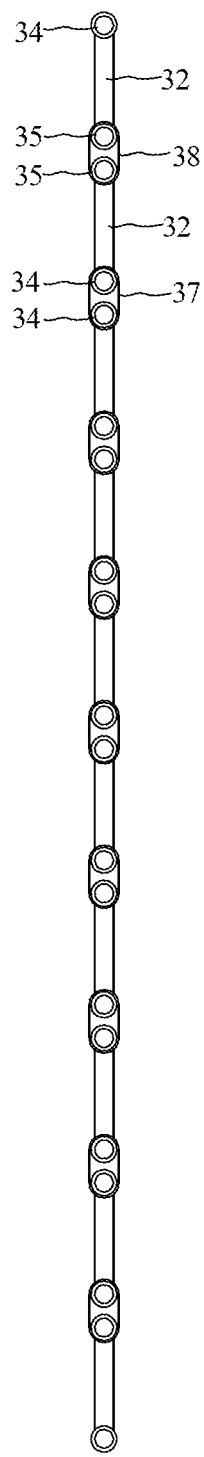
FIG. 21 is another schematic diagram of supporting plates in an unfolded state provided by an embodiment of the present disclosure.

FIG. 18 is a schematic diagram of supporting plates in a folded state provided by an embodiment of the present disclosure, FIG. 19 is another schematic diagram of supporting plates in a folded state provided by an embodiment of the present disclosure, FIG. 20 is a schematic diagram of supporting plates in an unfolded state provided by an embodiment of the present disclosure, and FIG. 21 is another schematic diagram of supporting plates in an unfolded state provided by an embodiment of the present disclosure. In an embodiment, as shown in FIG. 18 to FIG. 21, the supporting plate 30 includes a supporting body 32 and connecting portions 33 located on a side of the supporting body 32 close to the guide rail 4, and the connecting portions 33 include a first connecting portion 34 and a second connecting portion 35.

The supporting assembly 29 further includes connecting members 36, and the connecting portions 33 of two adjacent supporting plates 30 are rotatably connected by the connecting members 36. The connecting member 36 include a first connecting member 37 and a second connecting member 38. The first connecting portions 34 of two adjacent supporting plates 30 are connected to each other by the first connecting member 37, or the second connecting portions 35 of two adjacent supporting plates 30 are connected to each other by the second connecting member 38. The first connecting portion 34 is at least partially inserted into the guide rail 4, and the first connecting portion 34 can move along the sliding direction of the guide rail 4.

When the flexible display screen 1 is in the folded state, the supporting surfaces of the multiple supporting plates 30 for supporting the flexible display screen 1 intersects the first direction x or the second direction y. For example, a plane of the support surface is perpendicular to the first direction x or the second direction y. In this state, the first connecting portions 34 of the multiple supporting plates 30 are at least partially inserted into groove on the innermost guide rail 4 successively sleeved. When the flexible display screen 1 is switched from the folded state to the flattened state, the first connecting portions 34 of the multiple supporting plates 30 slide synchronously in the grooves of the guide rail 4 along the first direction x, so that sliding trajectories of the first connecting portion 34 are limited and thus the supporting surfaces of the multiple supporting plates 30 are located in a same plane when the multiple supporting plates 30 are unfolded, thereby improving the screen flatness of the flexible display screen 1.

When the flexible display screen 1 is switched from the folded state to the unfolded state, the multiple supporting plates 30 are unfolded, and the positions of the second connecting portions 35 of the supporting plates 30 will change accordingly until the first connecting portions 34 and the second connecting portions 35 of the multiple supporting plates 30 are arranged in the first direction x or in the second direction y. Therefore, in order to prevent the side wall of the guide rail 4 from blocking the second connecting portion 35, a length of the portion 35 protruding from the supporting body 32 is set to be smaller. In an embodiment of the present disclosure, the length of the second connecting portion 35 protruding from the supporting body 32 is smaller than a length of the first connecting portion 34 protruding from the supporting body 32, which can ensure a normal unfolding of the supporting plate 30.

Figure 22:
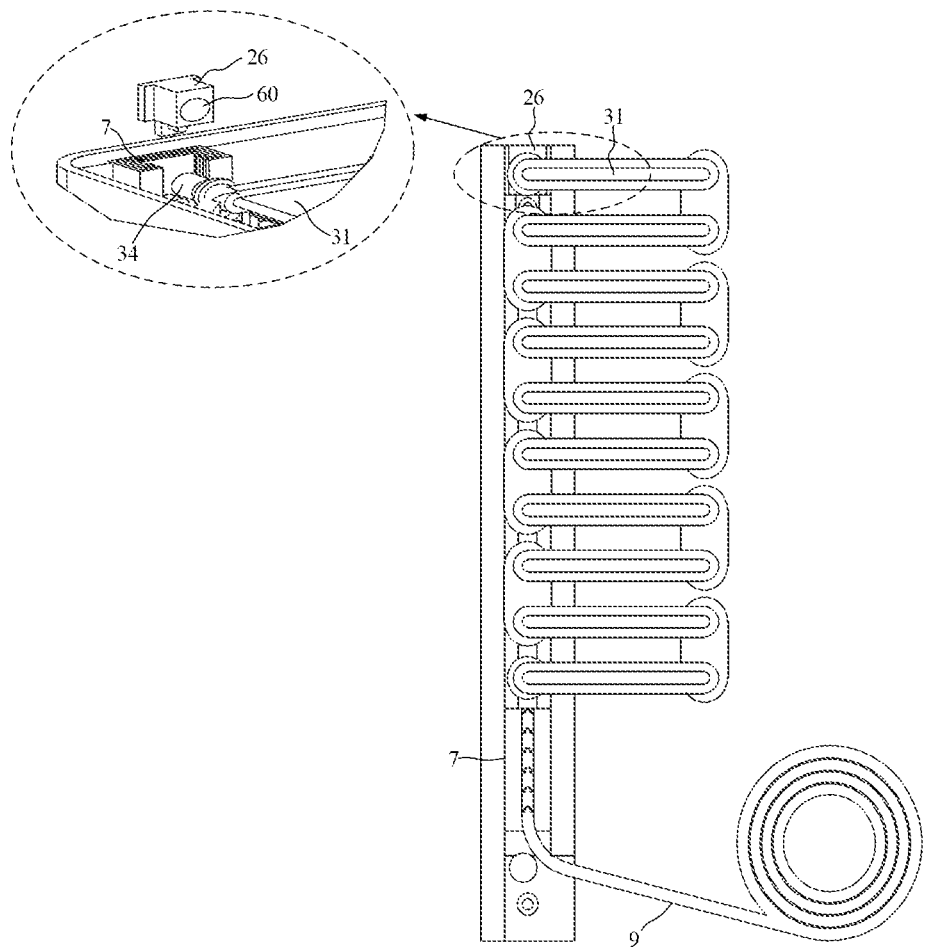
FIG. 22 is a schematic diagram of a connection between a first supporting plate and a first guide rail provided by an embodiment of the present disclosure.

With reference to FIG. 20, when the first supporting plate 31 is connected to the first guide rail 7, the first connecting portion 34 of the first supporting plate 31 can be connected to the sleeve 26 of the first guide rail 7. FIG. 22 is a schematic diagram of a connection between a first supporting plate and a first guide rail provided by an embodiment of the present disclosure. As shown in FIG. 22, the sleeve includes an insertion hole 60, and the first connecting portion 34 of the first supporting plate 31 and the insertion hole 60 are fixed to each other by inserting, thereby realizing the connection between the first supporting plate 31 and the first guide rail 7.

Figure 23:
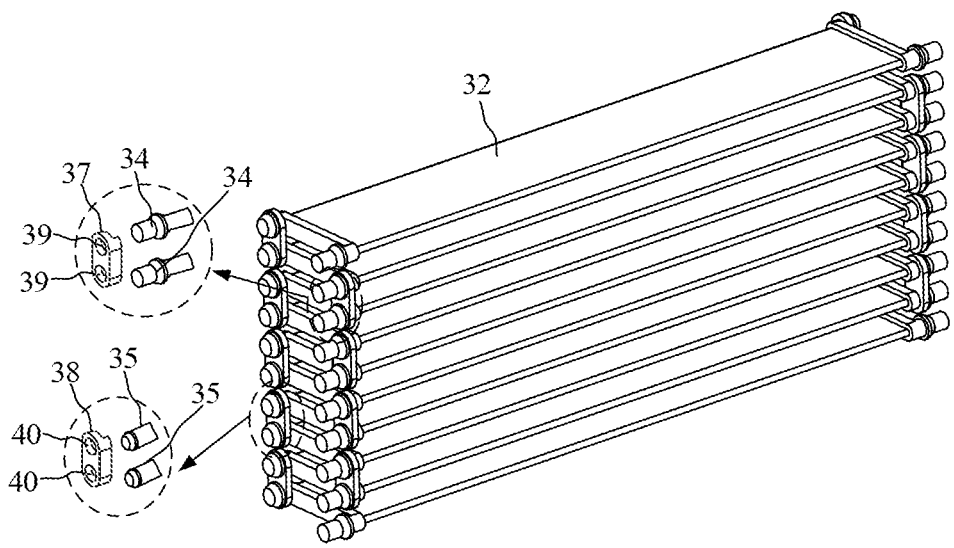
FIG. 23 is a schematic diagram of a connector provided by an embodiment of the present disclosure.

In an embodiment of the present disclosure, the first connecting member 37 and the first connecting portion 34 can be fixed by inserting, and the second connecting member 38 and the second connecting portion 35 can be fixed by inserting. FIG. 23 is a schematic diagram of a connector provided by an embodiment of the present disclosure. As shown in FIG. 23, two first through holes 39 are provided on the first connecting member 37, and the first connecting portion 34 of two adjacent supporting plates 30 are respectively inserted into the two first through holes 39 to realize the fixation of the two supporting plates 30 and the first connecting member 37. Two second through holes 40 are provided on the second connecting member 38. The second connecting portions 35 of adjacent supporting plates 30 are respectively inserted into the two second through holes 40 to realize the fixation of the two supporting plates 30 and the second connecting member 38. In an embodiment, a distance between the two first through holes 39 on the first connecting member 37 is greater than or equal to a thickness of the supporting body 32, and a distance between the two second through holes 40 on the second connecting member 38 is also greater than or equal to the thickness of the supporting body 32, which ensures that the supporting plate 30 can be folded normally.

Figure 24:
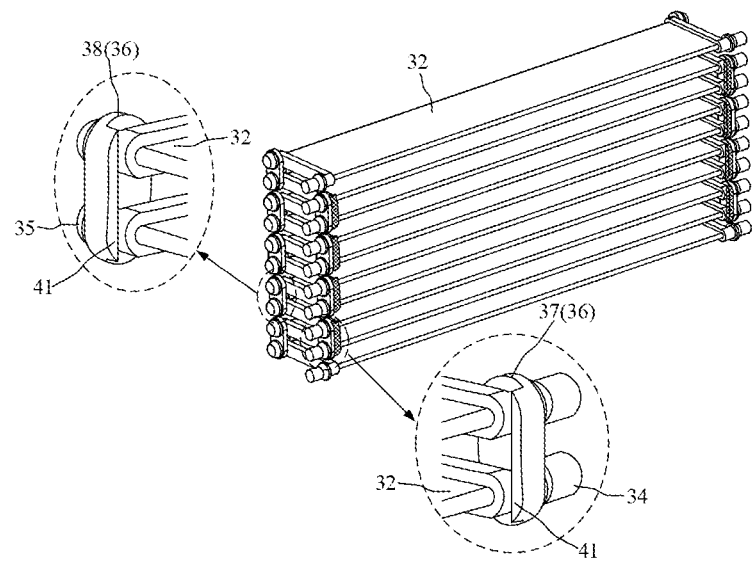
FIG. 24 is another schematic diagram of a connector provided by an embodiment of the present disclosure.

FIG. 24 is another schematic diagram of a connector provided by an embodiment of the present disclosure. In an embodiment, as shown in FIG. 24, the connecting members 36 include limiting structures 41 configured to limit rotation angles of the supporting bodies 32 relative to the connecting members 36, and a limiting structure 41 of the first connecting member 37 and a limiting structure 41 of the second connecting member 38 are opposite to each other.

Figure 25:
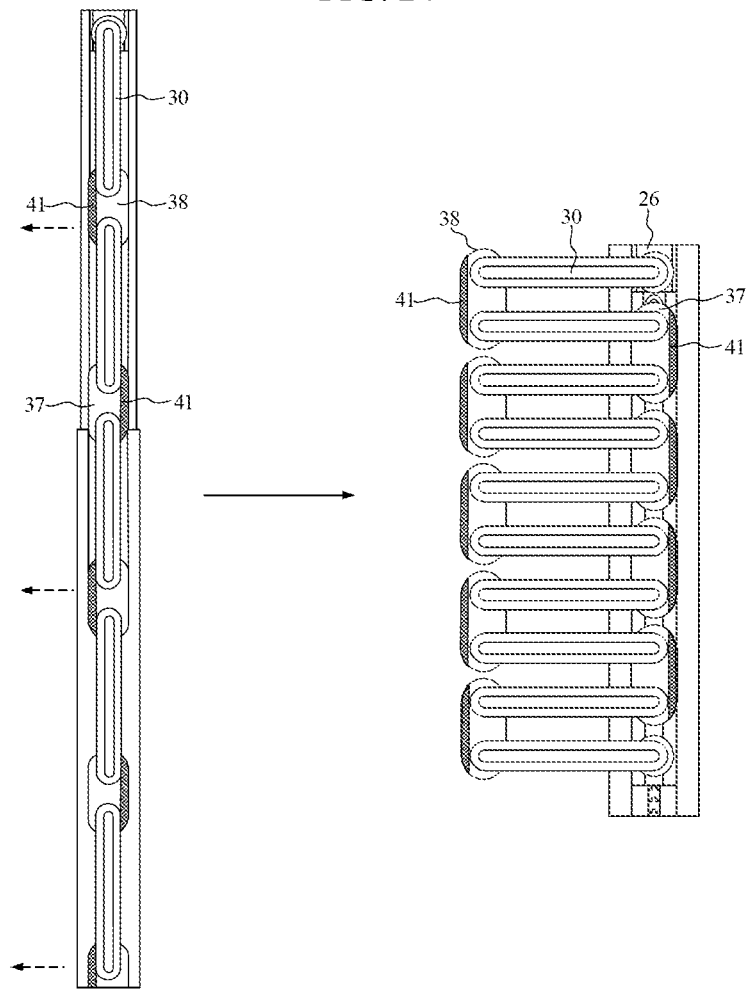
FIG. 25 is a schematic diagram illustrating that a restriction structure limits a movement direction of the supporting plate provided by an embodiment of the present disclosure.

FIG. 25 is a schematic diagram illustrating that a restriction structure limits a movement direction of the supporting plate provided by an embodiment of the present disclosure. As shown in FIG. 25, when the flexible display screen 1 is switched from the unfolded state to the folded state, the limiting structure 41 is provided to make the second connecting portions 35 of the multiple supporting plates 30 move towards a same side (moving towards a direction indicated by the dashed arrow) when the guide rail 4 slides along the second direction y, which limits the bending directions of the multiple supporting plates 30 to realize that the multiple supporting plates 30 are folded and sleeved in sequence, thereby making the folded flexible display screen 1 be in the folded state shown in FIG. 16.

Figure 26:
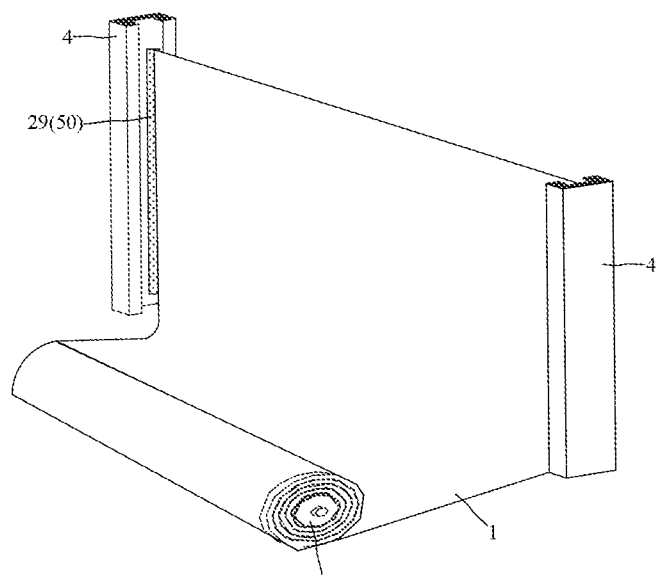
FIG. 26 is another schematic diagram of a display device in a folded state provided by an embodiment of the present disclosure.
Figure 27:
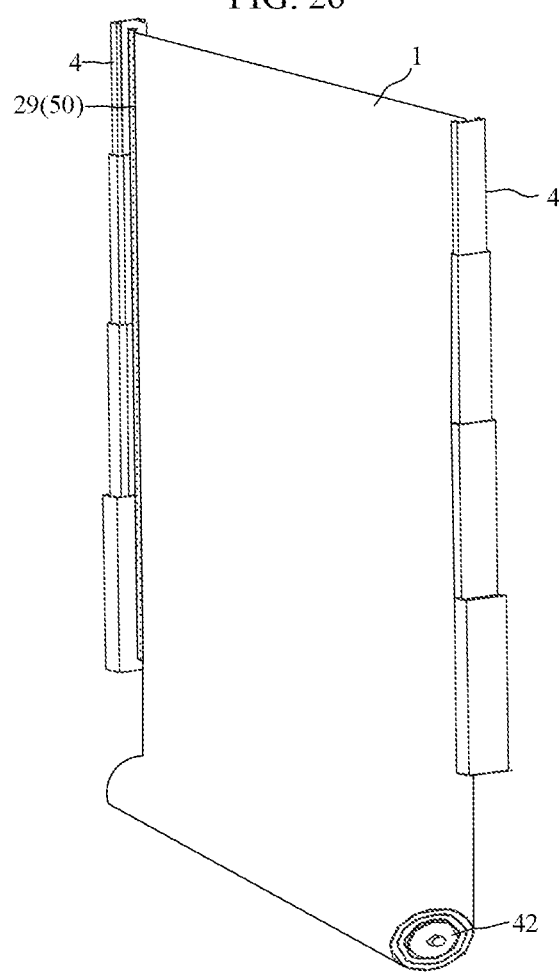
FIG. 27 is another schematic diagram of a display device in an unfolded state provided by an embodiment of the present disclosure.

FIG. 26 is another schematic diagram of a display device in a folded state provided by an embodiment of the present disclosure. FIG. 27 is another schematic diagram of a display device in an unfolded state provided by an embodiment of the present disclosure. In an embodiment, as shown in FIG. 26 and FIG. 27, the display device further includes a second rotating shaft 42 for winding the flexible display screen 1, the control structure 2 further includes a supporting assembly 29 including a supporting bar 50, and the supporting bar 50 is located at a side of the flexible display screen 1 close to the guide rail 4 and connected to the flexible display screen 1. When the flexible display screen 1 is switched from the folded state to the unfolded state, the second shaft 42 rotates to unwind the flexible display screen 1, and the guide rail 4 drives the flexible display screen 1 to unfold through the supporting bar 50. When the flexible display screen 1 is switched from the unfolded state to the folded state, the second shaft 42 rotates to wind the flexible display screen 1, and the guide rail 4 drives the flexible display screen 1 through the supporting bar 50. The supporting bar 50 can be a structure driving the flexible display screen 1 to unfold or fold, such as a chain, a telescopic shaft, or a rubber strip.

With such configuration, the second rotating shaft 42, the supporting bar 50 and the guide rail 4 cooperate with each other. When the guide rail 4 slides, the second rotating shaft 42 is used to synchronously wind or unwind the flexible display screen 1 to make the flexible display screen 1 to be flattened or curled. With such structure, the flexible display screen is curled in the folded state.

In an embodiment, with reference to FIG. 1 and FIG. 2 again, the display device further includes a housing 43. The housing 43 includes a bottom wall 44 and a side wall 45 intersecting the bottom wall 44. The bottom wall 44 and the side wall 45 form an accommodating cavity 46 with an opening. When the display device is in the folded state, the control structure 2 is located in the accommodating cavity 46, which not only achieves a dust-proof function, but also improves the aesthetics of the display device.

Figure 28:
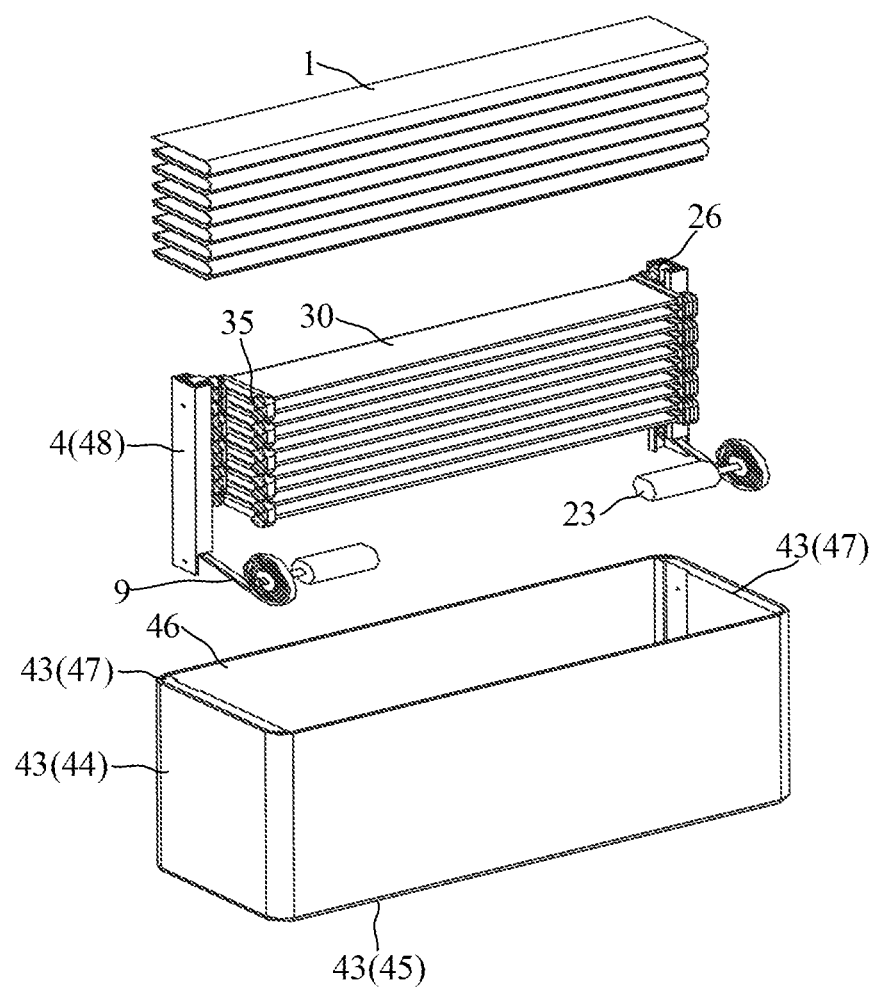
FIG. 28 is a schematic diagram of a display device provided by an embodiment of the present disclosure.
Figure 29:
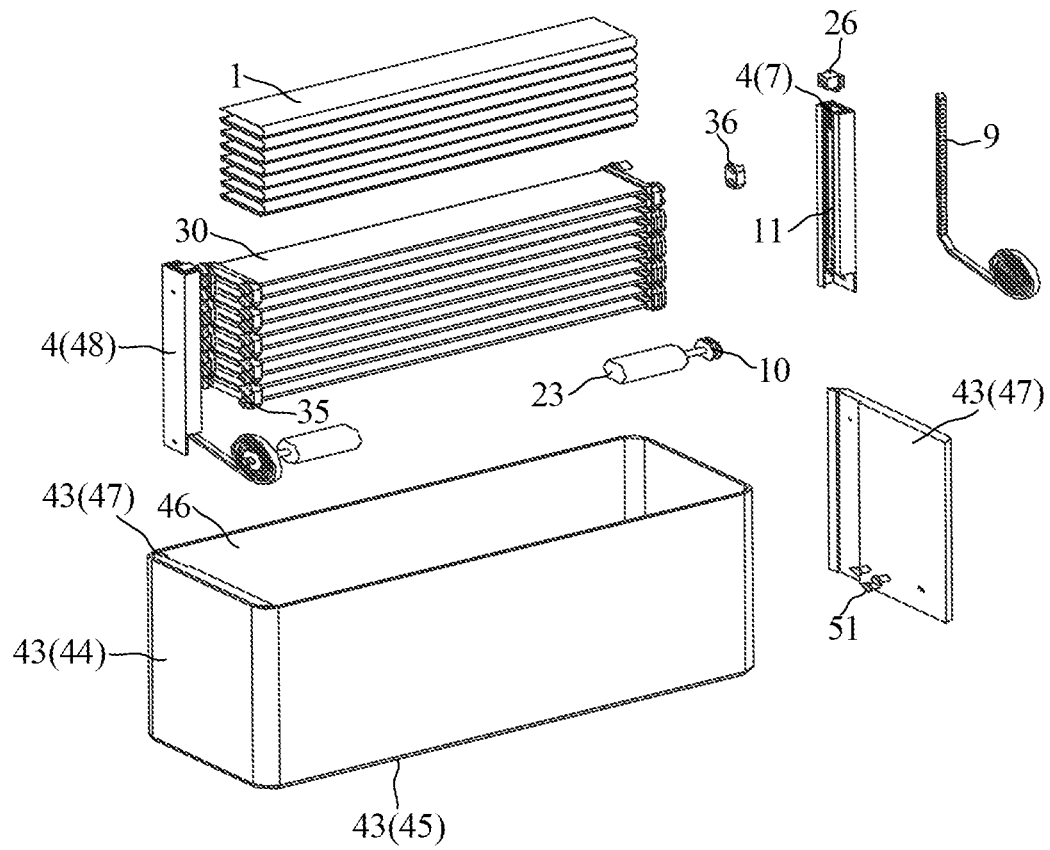
FIG. 29 is an exploded schematic diagram corresponding to FIG. 28.

FIG. 28 is a schematic diagram of a display device provided by an embodiment of the present disclosure. FIG. 29 is an exploded schematic diagram corresponding to FIG. 28. In an embodiment, as shown in FIG. 28, the housing includes an adapter 47 located in the accommodating cavity 46 and located at an inner side of the side wall 45. At least one protruding post 51 is provided on a side of the adapter 47 and configured to be rotatably connected to the first rotating shaft 10 to ensure structural stability. In an embodiment, when multiple guide rails are successively sleeved, the outermost guide rail 4 is a second guide rail 48, and the adapter 47 is also fixedly connected to the second guide rail 48, so as to improve the stability of the guide rail 4 when the multiple guide rails 4 slide, thereby make the guide rail 4 be more stable in the accommodating cavity 46.

Figure 30:
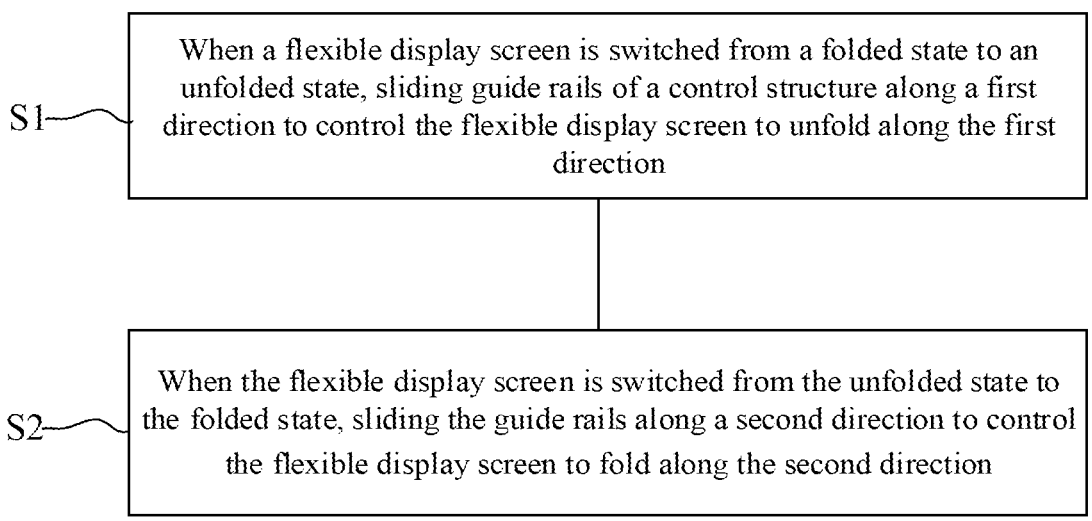
FIG. 30 is a flowchart of a method for controlling a display device provided by an embodiment of the present disclosure.

Based on the same concept, an embodiment of the present disclosure also provides a method for controlling a display device, which is used to control the above display device. With reference to FIG. 1 to FIG. 3, the flexible display screen 1 can assume a folded state and an unfolded state. FIG. 30 is a flowchart of a method for controlling a display device provided by an embodiment of the present disclosure. As shown in FIG. 30, the method includes: S1, when the flexible display screen 1 is witched from the folded state to the unfolded state, sliding the guide rail 4 of the control structure 2 along the first direction x to control the flexible display screen 1 to unfold along the first direction x; and S2, when the flexible display screen 1 is switched from the unfolded state to the folded state, sliding the guide rail 4 along the second direction y to control the flexible display screen 1 to fold along the second direction y.

In an embodiment of the present disclosure, the control structure 2 controls the flexible display screen 1 to be folded or flattened. When the flexible display screen 1 is switched from the folded state to the unfolded state, the control structure 2 can be configured to control a screen shape of the flexible display screen 1 formed after unfolding the flexible display screen, so that the screen of the flexible display screen 1 is flattened by the guide rail 4 to have a flat surface. At this time, the screen is located in a same unfolded plane, so as to avoid unevenness such as screen wrinkles, thereby improving the flattening effect of the flexible display screen, and further improving the display effect of the display device. The control structure 2 can also control the flexible display screen 1 to fold, so that the display device has a smaller volume in the folded state and occupies less space.

In an embodiment, in conjunction with FIG. 5 to FIG. 7, when the flexible display screen 1 is in the unfolded state, along an arrangement direction of the multiple guide rails 4, the first one of the guide rails 4 is a first guide rail 7, the control structure 2 further includes a sliding control assembly 8, the sliding control assembly 8 includes a hinge 9 and a first rotating shaft 10. The hinge 9 includes a first end connected to the first guide rail 7 and a second end connected to the first rotating shaft 10 and wound around the first rotating shaft 10.

Based on the above, the sliding the guide rail 4 along the first direction x includes: rotating the first rotating shaft 10, and controlling the hinge 9 wound around the first rotating shaft 10 to unwind, so that the hinge 9 drives the first guide rail 7 to move along the first direction x. The sliding the guide rail 4 along the second direction y includes: rotating the first rotating shaft 10, and controlling the hinge 9 to wind around the first rotating shaft 10, so that the hinge 9 drives the first guide rail 7 to move along the second direction y.

When the flexible display screen 1 is switched from the folded state to the unfolded state, the first rotating shaft 10 and the hinge 9 are synchronously controlled to apply an upward thrust along the first direction x to the first guide rail 7, so that the first guide rail 7 moves upward along the first direction x, and the limiting post 6 of the first guide rail 7 slides synchronously in the sliding groove 5 of the second guide rail 4. When the limiting post 6 slides to the top end of the sliding groove 5, it drives the second guide rail 4 start to move upward along the first direction x, . . . , and so on, until the multiple guide rails 4 are unfolded. The first end of the hinge 9 is connected to the first guide rail 7, and the multiple guide rails 4 can be controlled to slide upward one by one from the first guide rail 4, and the multiple guide rails 4 can be better unfolded. When the flexible display screen 1 is switched from the unfolded state to the folded state, the first rotating shaft 10 and the hinge 9 synchronously control the first guide rail 7 to move downward in the second direction y, and the limiting post 6 of the first guide rail 7 slide synchronously in the sliding grooves 5 of the second guide rail 4. When the limiting post 6 slides to the bottom end of the sliding groove 5, it drives the second guide rail 4 to start moving down along the second direction y, . . . , and so on, until the n guide rails 4 are sleeved successively.

In an embodiment, with reference to FIG. 15 to FIG. 17, the control structure 2 further includes a supporting assembly 29, which includes multiple supporting plates 30 sequentially connected to each other end to end. The multiple supporting plates 30 are arranged along the first direction x and configured to support the flexible display screen 1.

Based on the above, sliding the guide rail 4 along the first direction x to control the flexible display screen 1 to unfold along the first direction x includes: sliding the guide rail 4 along the first direction x to drive the multiple supporting plates 30 to unfold one by one, and driving, by the multiple supporting plates 30, the flexible display screen 1 to unfold along the first direction x, so that the supporting plates 30 support the screen of the flexible display screen 1 to be located in the same plane, improving its screen flatness. Sliding the guide rail 4 along the second direction y to control the flexible display screen 1 to fold along the second direction y includes: sliding the guide rail 4 along the second direction y to drive the supporting assembly 29 to fold, and driving, by the supporting assembly 29, the flexible display screen 1 to be folded along the second direction y.

In an embodiment, with reference to FIG. 26 and FIG. 27, the display device further includes a second rotating shaft 42 for winding the flexible display screen 1, the control structure 2 further includes a supporting assembly 29 including a supporting bar 50, and the supporting bar 50 is located on the side of the flexible display screen 1 close to the guide rail 4 and is connected to the flexible display screen 1.

Based on the above, sliding the guide rail 4 along the first direction x to control the flexible display screen 1 to unfold along the first direction x includes: rotating the second rotating shaft 42 to unwind the flexible display screen 1, and driving, by the guide rail 4, the flexible display screen 1 to unfold along the first direction x through the supporting bar 50. Sliding the guide rail 4 along the second direction y to control the flexible display screen 1 to fold along the second direction y includes: rotating the second rotating shaft 42 to wind the flexible display screen 1, and driving, by the guide rail 4, the flexible display screen 1 to fold along the second direction y through the supporting bar 50.

With such configuration, the second rotating shaft 42, the supporting bar 50 and the guide rail 4 cooperate with each other. When the guide rail 4 slides, the second rotating shaft 42 synchronously winds and unwinds the flexible display screen 1 to make the flexible display screen 1 to be flattened or curled. With such structure, the flexible display screen is curled in the folded state.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, adjustments, and substitutions without departing from the scope of the present disclosure.

What is claimed is:

1. A display device, comprising: a flexible display screen; and a control structure configured to control the flexible display screen to assume a folded state or an unfolded state, wherein the control structure comprises a guide rail assembly comprising guide rails, and two adjacent guide rails of the guide rails are slidably connected to each other; and the flexible display screen is unfolded along a first direction and folded along a second direction, and a sliding direction of each of the guide rails is the same as the first direction or the second direction; wherein when the flexible display screen is in the folded state, the guide rails are successively sleeved; wherein when the flexible display screen is in the unfolded state, along an arrangement direction of the guide rails, a first one of the guide rails is a first guide rail; and the control structure further comprises a sliding control assembly connected to the first guide rail and configured to control the first guide rail to move along the first direction or the second direction; wherein the sliding control assembly comprises a hinge and a first rotating shaft, wherein the hinge comprises a first end connected to the first guide rail and a second end connected to the first rotating shaft and configured to wind around the first rotating shaft.

2. The display device of claim 1, wherein;
when the flexible display screen is switched from the folded state to the unfolded state, the first rotating shaft rotates to control the hinge wound around the first rotating shaft to unwind in such a manner that the hinge drives the first guide rail to moves along the first direction; and
when the flexible display screen is switched from the unfolded state to the folded state, the first rotating shaft rotates to control the hinge to wind around the first rotating shaft in such a manner that the hinge drives the first guide rail to move in the second direction.

3. The display device of claim 2, wherein the guide rail assembly further comprises a first limiting groove connected to the first rail, wherein the first limiting groove is configured to cause the hinge to extend along the first direction or the second direction.

4. The display device of claim 3, wherein the first limiting groove and the first guide rail define a tubular channel, and the hinge comprises a part located in the tubular channel.

5. The display device of claim 4, wherein the guide rail assembly further comprises second limiting grooves configured to cause the hinge to extend in the first direction or the second direction; and
the second limiting grooves are connected to the remaining guide rails of the guide rails except for the first guide rail, respectively; and when the flexible display screen is in the folded state, two adjacent second limiting grooves of the second limiting grooves are sleeved with one another and are in contact with each other, and one of the second limiting grooves that is adjacent to the first limiting groove is sleeved with the first limiting groove.

6. The display device of claim 2, wherein the hinge comprises hinge components, every two of the hinge components are connected to each other, and a protrusion and a recess are provided on two opposite sides of each of the hinge components, respectively; and
when the flexible display screen is switched from the folded state to the unfolded state, the protrusion of one hinge component of the hinge component of the released hinge is inserted into the recess of another hinge component of the hinge components that is adjacent to the one hinge component.

7. The display device of claim 2, wherein the hinge comprises a first hinge portion, a second hinge portion, and a third hinge portion that are sequentially connected to each other, wherein the first hinge portion is wound around the first rotating shaft, and the third hinge portion is located in one of the guide rails; and
the second hinge portion comprises a first chain section and a second chain section, wherein the first chain section is connected to the first hinge portion and extends along a straight line intersecting the first direction or the second direction, and the second chain section is connected between the first chain section and the third hinge portion and extends along an arc.

8. The display device of claim 2, wherein the sliding control assembly further comprises a motor connected to the first rotating shaft and configured to control the first rotating shaft to rotate.

9. The display device of claim 2, wherein the first guide rail comprises a first end and a second end, and the first direction is a direction from the second end to the first end; and
the first end of the hinge is connected to the first end of the first guide rail.

10. The display device of claim 1, wherein the control structure further comprises a supporting assembly, wherein the supporting assembly comprises supporting plates that are sequentially connected to each other end to end, and the supporting plates are arranged along the first direction and configured to support the flexible display screen;
when the flexible display screen is switched from the folded state to the unfolded state, the guide rails slide along the first direction to drive the supporting plates to unfold one by one; and
when the flexible display screen is switched from the unfolded state to the folded state, the guide rails slide along the second direction to drive the supporting assembly to fold.

11. The display device of claim 10, wherein the supporting plates are fixedly connected to the flexible display screen.

12. The display device of claim 10, wherein when the flexible display screen is in the unfolded state, along an arrangement direction of the guide rails, a first one of the guide rails is a first guide rail; and
along the first direction, a first one of the supporting plates is a first supporting plate connected to the first guide rail.

13. The display device of claim 10, wherein each of the supporting plates comprises a supporting body and connecting portions located on a side of the supporting body close to one of the guide rails, and the connecting portions comprise a first connecting portion and a second connecting portion;

the supporting assembly further comprises connecting members through which the connecting portions of two adjacent supporting plates of the supporting plates are rotatably connected to each other;
the connecting members comprise a first connecting member and a second connecting member, and the first connecting portions of two adjacent supporting plates of the supporting plates are connected to each other by the first connecting member, or the second connecting portions of the two adjacent supporting plates are connected to each other by the second connecting member; and
the first connecting portion is at least partially inserted into one of the guide rails and is movable along the sliding direction of the guide rail.

14. The display device of claim 13, wherein the connecting members comprise limiting structures configured to limit rotation angles of the supporting bodies of the supporting plates relative to the connecting members; and
the limiting structures comprise a limiting structure of the first connecting member and a limiting structure of the second connecting member that is opposite to the limiting structure of the first connecting member.

15. The display device of claim 1, further comprising:
a second rotating shaft configured to wind and unwind the flexible display screen;
wherein the control structure further comprises a supporting assembly comprising a supporting bar, and the supporting bar is located on a side of the flexible display screen close to the guide rails and is connected to the flexible display screen;
when the flexible display screen is switched from the folded state to the unfolded state, the second rotating shaft rotates to unwind the flexible display screen, and the guide rails drive the flexible display screen to unfold through the supporting bar; and
when the flexible display screen is switched from the unfolded state to the folded state, the second rotating shaft rotates to wind the flexible display screen, and the guide rails drive the flexible display screen to fold through the supporting bar.

16. A method for controlling a display device comprising: a flexible display screen; and
a control structure configured to control the flexible display screen to assume a folded state or an unfolded state,
wherein the control structure comprises a guide rail assembly comprising guide rails, two adjacent guide rails of the guide rails are slidably connected to each other; and
the flexible display screen is unfolded along a first direction and folded along a second direction, and a sliding direction of each of the guide rails is the same as the first direction or the second direction,
the method comprising:
when the flexible display screen is switched from the folded state to the unfolded state, sliding the guide rails of the control structure along the first direction to control the flexible display screen to unfold along the first direction; and
when the flexible display screen is switched from the unfolded state to the folded state, sliding the guide rails along the second direction to control the flexible display screen to fold along the second direction;
wherein when the flexible display screen is in the folded state, the guide rails are successively sleeved.

17. The method of claim 16, wherein when the flexible display screen is in the unfolded state, along an arrangement direction of the guide rails, a first one of the guide rails is a first guide rail;

the control structure further comprises a sliding control assembly, the sliding control assembly comprises a hinge and a first rotating shaft, wherein the hinge comprises a first end connected to the first guide rail and a second end connected to the first rotating shaft and configured to wind around the first rotating shaft;

said sliding the guide rail along the first direction comprises: rotating the first rotating shaft to control the hinge wound around the first rotating shaft to unwind in such a manner that the hinge drives the first guide rail to move along the first direction; and said sliding the guide rail along the second direction comprises: rotating the first rotating shaft to control the hinge to wind around the first rotating shaft in such a manner that the hinge drives the first guide rail to move along the second direction.

18. The method of claim 16, wherein the control structure further comprises a supporting assembly, wherein the supporting assembly comprises supporting plates that are sequentially connected to each other end to end, and the supporting plates are arranged along the first direction and configured to support the flexible display screen;

said sliding the guide rails along the first direction to control the flexible display screen to unfold along the first direction comprises: sliding the guide rails along the first direction to drive the supporting plates to unfold one by one, and driving, by the supporting plates, the flexible display screen to unfold along the first direction;

said sliding the guide rails along the second direction to control the flexible display screen to fold along the second direction comprises: sliding the guide rails along the second direction to drive the supporting assembly to fold, and driving, by the supporting assembly, the flexible display screen to fold along the second direction.

\* \* \* \* \*